United States Patent [19]

Tanaka et al.

[11] Patent Number: 5,631,307
[45] Date of Patent: May 20, 1997

[54] PHOTOPOLYMERIZATION INITIATOR COMPOSITION AND PHOTOPOLYMERIZABLE COMPOSITION

[75] Inventors: Yasuhiro Tanaka; Yasumasa Toba; Madoka Yasuike; Tadashi Tanoue; Kaoru Nakajima, all of Tokyo, Japan

[73] Assignee: Toyo Ink Manufacturing Co., Ltd., Tokyo, Japan

[21] Appl. No.: 495,795

[22] Filed: Jun. 27, 1995

[30] Foreign Application Priority Data

Jun. 28, 1994 [JP] Japan .................... 6-146017
Mar. 17, 1995 [JP] Japan .................... 7-058341

[51] Int. Cl.$^6$ .................................................. C08F 2/46
[52] U.S. Cl. ..................................... 522/25; 522/31
[58] Field of Search ................................. 522/25, 31

[56] References Cited

U.S. PATENT DOCUMENTS 5,550,453 3/1996 Toba et al. .................... 522/25

FOREIGN PATENT DOCUMENTS 555058 8/1993 European Pat. Off. .

*Primary Examiner*—Mark Chapman
*Attorney, Agent, or Firm*—Wenderoth, Lind & Ponack

[57] ABSTRACT

A photopolymerization initiator composition almost free from deactivation and capable of giving a photopolymerizable composition which is almost free from a decrease in the photopolymerization rate in a medium having a high viscosity and shows a high curing rate, containing (A) a sulfonium organoboron complex or oxosulfonium organoboron complex of the formula (1),

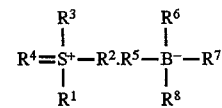

(B) a sensitizer having electron donating capability and electron acceptability in an excited state.

8 Claims, No Drawings

PHOTOPOLYMERIZATION INITIATOR COMPOSITION AND PHOTOPOLYMERIZABLE COMPOSITION

FIELD OF THE INVENTION

The present invention relates to a photopolymerization initiator composition which generates free radical when exposed to light, and a photopolymerizable composition containing the photopolymerization initiator composition and a compound having an ethylenically unsaturated bond which can undergo addition polymerization initiated by free radical. More specifically, it relates to a photopolymerization initiator composition which allows a photopolymerizable compound to be polymerizod in a short period of time and can be suitably used, for example, in a photo-setting ink, photo-setting paint and coating composition, photo-setting adhesive and sealing agent, photo-setting sealant and composite, a photo-setting ink jet, a photo-setting microcapsule, a photosensitive printing plate, a photoresist ink, a proofing material, an optically molding resin and a hologram material, and a photopolymerizable composition.

PRIOR ART OF THE INVENTION

As a photopolymerization initiator or a photopolymerization initiator composition, a variety of materials and compositions are known, and their specific examples are described in many books such as "Ultraviolet Light Curing System" (KATO Kiyomi, Sogo Gijutsu (General Technology) Center, 1988), "The Latest Version—UV Curing Technology" (Gijutsu Joho (Technical Information) Association, 1991), or the like. Included in these photopolymerization initiators or photopolymerization initiator compositions are, for example, photopolymerization initiators which generate free radical by intramolecular bond cleavage such as chloroacetophenone, diethoxyacetophenone, hydroxyacetophenone, 1-hydroxyeyclohexyl phenyl ketone, α-aminoacetophenone, benzoyl butyl ether, benzyl dimethyl ketal and acylphosphine oxide and an intermolecular hydrogen-withdrawing type photopolymerization initiator compositions containing a ketone or quinone-based compound and a hydrogen donor.

A photopolymerizable composition which can can be polymerized when exposed to light can be obtained by combining at least one of the above known photopolymerization initiators and free radical-polymerizable compound having an ethylenically unsaturated bond. However, when free radical is derived from intramolecular bond cleavage, the photopolymerization initiator is deactivated due to the recombination of generated free radical, so that the radical generation efficiency decreases. The intermolecular hydrogen-withdrawing type photopolymerization initiator composition has a problem in that the reaction rate is a diffusion rate regulator due to a reaction between two molecules, so that the photopolymerization rate decreases in a medium having a high viscosity. It is therefore desired to develop a photopolymerization initiator which has further improved sensitivity characteristic for increasing the curing rate.

SUMMARY OF THE INVENTION

It is an object of the present invention to provide a photopolymerization initiator composition which is almost free from deactivation and can give a photopolymerizable composition which is almost free from a decrease in the photopolymerization rate in a medium having a high viscosity and which shows a high curing rate.

According to the present invention, there is provided a photopolymerization initiator composition containing (A) a sulfonium organoboron complex or oxosulfonium organoboron complex of the formula (1),

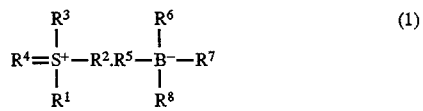

wherein $R^1$ is benzyl, substituted benzyl, phenacyl, substituted phenacyl, aryloxy, substituted aryloxy, alkenyl or substituted alkenyl, each of $R^2$ and $R^3$ is independently benzyl, substituted benzyl, phenacyl, substituted phenacyl, aryloxy, substituted aryloxy, alkenyl, substituted alkenyl, alkyl, substituted alkyl, aryl, substituted aryl, aralkyl, substituted aralkyl, alkynyl, substituted alkynyl, alicyclic, substituted alicyclic, alkoxy, substituted alkoxy, alkylthio, substituted alkylthio, amine, substituted amine, arylthio or substituted arylthio, or $R^2$ and $R^3$ bond to each other to form a cyclic structure, $R^4$ is oxygen or a lone pair of electrons and each of $R^5$, $R^6$, $R^7$ and $R^8$ is independently alkyl, substituted alkyl, aryl, substituted aryl, aralkyl, substituted aralkyl, alkenyl or substituted alkenyl, provided that in no case can all of $R^5$, $R^6$, $R^7$ and $R^8$ be aryl, or substituted aryl, and (B) a sensitizer having electron donating capability and electron acceptability in an excited state.

According to the present invention, further, there is provided a photopolymerizable composition containing the above photopolymerization initiator composition and a compound having an ethylenically unsaturated bond.

DETAILED DESCRIPTION OF THE INVENTION

The present inventors have made diligent studies for achieving the above objects, and have arrived at the present invention. The photopolymerization initiator composition provided by the present invention makes a photopolymerizable compound undergo polymerization and can be suitably used in a photo-setting ink, photo-setting paint and coating composition, photo-setting adhesive and sealing agent, photo-setting sealant and composite, a photo-setting ink jet, a photo-setting microcapsule, a photosensitive printing plate, a photoresist ink, a proofing material, an optically molding resin and a hologram material. That is, the present invention provides a photopolymerization initiator composition containing (A) a sulfonium organoboron complex or oxosulfonium organoboron complex of the formula (1),

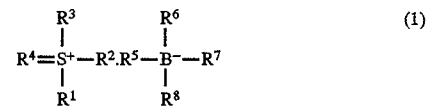

wherein $R^1$ is benzyl, substituted benzyl, phenacyl, substituted phenacyl, aryloxy, substituted aryloxy, alkenyl or substituted alkenyl, each of $R^2$ and $R^3$ is independently benzyl, substituted benzyl, phenacyl, substituted phenacyl, aryloxy, substituted aryloxy, alkenyl, substituted alkenyl, alkyl, substituted alkyl, aryl, substituted aryl, aralkyl, substituted aralkyl, alkynyl, substituted alkynyl, alicyclic, substituted alicyclic, alkoxy, substituted alkoxy, alkylthio, substituted alkylthio, amino, substituted amino, arylthio or substituted arylthio, or $R^2$ and $R^3$ bond to each other to form a cyclic structure, $R^4$ is oxygen or a lone pair of electrons, and each of $R^5$, $R^6$, $R^7$ and $R^8$ is independently alkyl, substituted alkyl, aryl, substituted aryl, aralkyl, substituted aralkyl, alkenyl or substituted alkenyl, provided that in no case can all of $R^5$, $R^6$, $R^7$ and $R^8$ be aryl, or substituted aryl, and (B) a sensitizer having electron donating capability and electron acceptability in an excited state. Further, the present invention provides a photopolymerizable composition containing the above photopolymerization initiator composition and a compound (C) having an ethylenically unsaturated bond.

In the sulfonium organoboron complex or oxosulfonium organoboron complex (A) used in the present invention, the sulfonium cation portion thereof has electron-accepting properties, and the organoboron anion portion has electron-donating properties due to its molecular properties. The sulfonium organoboron complex or the oxosulfonium organoboron complex is decomposed by a redox reaction based on the donation and reception of electron, and free radicals are generated from these two portions. When the sensitizer (B) having both the electron donating capability and electron acceptability in an excited state is co-used, the generation of free radical by an electron donating reaction and the generation of free radical by an electron accepting reaction take place concurrently when the photopolymerization initiator composition is exposed to light, and as a result, the photopolymerization initiator composition can work as an excellent photopolymerization initiator. This is a concept which no prior art has had, and can be accomplished by the present invention for the first time.

The sulfonium organoboron complex of the formula (1) can be synthesized by the method disclosed in JP-A-5-213861 and JP-A-5-255347.

In the formula (1), $R^1$ is benzyl, substituted benzyl, phenacyl, substituted phenacyl, aryloxy, substituted aryloxy, alkenyl or substituted alkenyl. The substituted benzyl includes p-cyanobenzyl, p-nitrobenzyl, p-chlorobenzyl, p-hydroxybenzyl, p-methylbenzyl, p-methoxybenzyl, p-dimethylaminobenzyl and 1- or 2-naphthylmethylene. The substituted phenacyl includes p-cyanophenacyl, p-nitrophenacyl, p-chlorophenacyl, p-hydroxyphenacyl, p-methylphenacyl and p-dimethylaminophenacyl. The aryloxy or substituted aryloxy includes p-cyanophenoxy, p-nitrophenoxy, p-chlorophenoxy, phenoxy, p-tolyloxy, p-methoxyphenoxy and p-dimethylaminophenoxy. The alkenyl or substituted alkenyl includes vinyl, 1-propenyl, 1-butenyl and 3,3-dicyano-1-propenyl.

Each of $R^2$ and R3 is independently benzyl, substituted benzyl, phenacyl, substituted phenacyl, aryloxy, substituted aryloxy, alkenyl, substituted alkenyl, alkyl, substituted alkyl, aryl, substituted aryl, aralkyl, substituted aralkyl, alkynyl, substituted alkynyl, an alicyclic group, a substituted alicyclic group, an alkoxy group, a substituted alkoxy group, alkylthio, substituted alkylthio, amino, substituted amino, arylthio or substituted arylthio. The substituted benzyl, the substituted phenacyl, the aryloxy or substituted aryloxy and the alkenyl or substituted alkenyl include those specified concerning $R^1$ The alkyl or substituted alkyl includes methyl, ethyl, n-propyl, isopropyl, n-butyl, isobutyl, sec-butyl, tert-butyl, pentyl, hexyl, octyl, decyl, dodecyl, octadecyl, allyl, salicylic, acetonyl, cyanomethyl, chloromethyl, bromomethyl, methoxycarbonylmethyl, ethoxycarbonylmethyl, menthyl and pinanyl. The aryl or substituted aryl includes phenyl, p-tolyl, xylyl, mesityl, cumenyl, p-methoxyphenyl, biphenylyl, naphthyl, anthryl, phenathryl, p-cyanophenyl, p-nitrophenyl, 2,4-bis (trifluoromethyl)phenyl, p-fluorophenyl, p-chlorophenyl, p-dimetylaminophenyl and p-phenylthiophenyl. The alkynyl or substituted alkynyl includes ethynyl, 2-tert-butylethynyl and 2-phenylethynyl. The alicyclic or substituted alicyclic group includes cyclopentyl, cyclohexyl, norbornyl, bornyl and 1-cyclohexenyl. The alkoxy or substituted alkoxy group includes methoxy, ethoxy, n- or isopropoxy, n-, sec- or tert-butoxy, benzyloxy, p-cyanobenzyloxy, p-chlorobenzyloxy, p-nitrobenzyloxy, p-methylbenzyloxy and p-methoxybenzyloxy. The alkylthio or substituted alkylthio includes methylthio, ethylthio and butylthio. The substituted amino includes methylamino, dimethylamino, diethylamino, cyclohexylamino, anilino, piperidino and morpholino. The arylthio or substituted arylthio includes phenylthio, p-tolylthio and p-cyanophenylthio. Further, $R^2$ and $R^3$ may bond to each other to form a cyclic structure. The cyclic structure includes cyclic structures of an optionally substituted alkylene group such as tetramethylene, pentamethylene and 1,4-dichlorotetramethylene, ethylenedioxy, diethytenedioxy, adipoyl and ethylenedithio.

Further, in the formula (1), each of $R^5$, $R^6$, $R^7$ and $R^8$ is independently alkyl, substituted alkyl, aryl, substituted aryl, aralkyl, substituted aralkyl, alkenyl or substituted alkenyl, provided that in no case can all of $R^5$, $R^6$, $R^7$ and $R^8$ be aryl, or substituted aryl.

The above alkyl or substituted alkyl includes methyl, ethyl, n-propyl, isopropyl, n-butyl, isobutyl, sec-butyl, tert-butyl, pentyl, hexyl, octyl, decyl, dodecyl, octadecyl, allyl and benzyl. The aryl or substituted aryl includes phenyl, p-tolyl, xylyl, mesityl, cumenyl, p-methoxyphenyl, naphtyl, 2,4-bis(trifluoromethyl)phenyl, p-fluorophenyl, p-chlorophenyl and p-bromophenyl. The alkenyl or substituted alkenyl includes vinyl, 1-propenyl, 1-butenyl and 3,3-dicyano-1-propenyl. The alkynyl or substituted alkynyl includes ethynyl, 2-tert-butylethynyl and 2-phenylethynyl.

The sulfonium organoboron complex or the oxosulfonium organoboron complex includes dimethyl-tert-butylsulfonium-tert-butylethyl borate, dimethylbenzylsulfonium phenyltriethyl borate, dimethyl(p-chlorobenzyl) sulfonium methyltriphenyl borate, dibutyl(p-bromobenzyl) sulfonium isopropyltriphenyl borate, dimethyl (p-cyanobenzyl)sulfonium butyltriphenylborate, dimethylphenacylsulfonium butyltriphenyl borate, dimethylphenacylsulfonium sec-butyltriphenyl borate, di-tert-butylphenacylsulfonium sec-butyltriphenyl borate, dimethyl (p-chlorophenacyl) tert-butylphenyl borate, dimethyl(p-bromophenacyl)sulfonium benzyltriphenyl borate, dimethyl (2-phenyl-3,3-dicyanopropen-2-yl) sulfonium butyltri(p-methoxyphenyl) borate, dibutylethoxysulfonium butyltri(p-fluoropenyl) borate, dimethylphenacylsulfonium butyltri (p-chlorophenyl) borate, methyl (dimethylamino) (p-tolyl) sulfonium butyltri(p-bromophenyl) borate, dimethyl (methylthio)sulfonium butyltris[3,5-bis(trifluoromethyl) phenyl] borate, dimethylphenylthiosulfonium sec-butyltri (p-methoxyphenyl) borate, methylphenyl (p-cyanobenzyl) sulfonium sec-butyltri(p-fluorophenyl) borate, methylphenylphenacylsulfonium butyltriphenyl borate, methylphenyl (2-phenyl-3,3-dicyanopropen-2-yl)sulfonium tert-butyltri(p-bromophenyl) borate, methylphenylethoxysulfonium butyltriphenyl borate, butylphenylphenoxysulfonium butyltriphenyl borate, dimethylaminobis(p-tolyl) sulfonium sec-butyltri(p-bromophenyl) borate, tetramethylenephenacylsulfonium sec-butyltriphenyl borate, dimethylallylsulfonium butyltriphenyl borate, dimethylcyanomethylsulfonium butyltriphenyl borate, dimethylacetonylsulfonium butyltriphenyl borate, dimethylethoxycarbonylmethylsulfonium tert-butyltri(p-chlorophenyl)

borate, dimethyl(methylthio)sulfonium butyltriphenyl borate, tetramethylene-p-cyanobenzylsulfonium sec-butyltri-p-fluorophenyl borate, dimethylbenzyloxosulfonium butyltriphenyl borate, dimethylphenacyloxosulfonium sec-butyl(p-chlorophenyl) borate, methylphenylbenzyloxosulfonium tert-butyltri(p-methoxyphenyl) borate, methylphenylphenacylsulfonium tert-butyltri(p-fluorophenyl) borate, diphenylbenzylsulfonium butyltriphenyl borate, dipheyl(p-chlorobenzyl)sulfonium butyltris(p-methoxyphenyl) borate, diphenyl (p-bromobenzyl) sulfonium butyltris(p-fluorophenyl) borate, diphenyl (p-cyanobenzyl)sulfonium butyltriphenyl borate, bis(p-tert-butylphenyl)benzylsulfonium butyltris(p-bromophenyl) borate, bis(p-chlorophenyl) (p-cyanobenzyl)sulfonium butyltriphenyl borate, diphenyl (p-cyanobenzyl)sulfonium phenyltributyl borate, diphenyl (p-cyanobenzyl)sulfonium dibutyldiphenyl borate, diphenyl(p-cyanobenzyl)sulfonium vinyltriphenyl borate, diphenyl (p-cyanobenzyl)sulfonium sec-butyltriphenyl borate, diphenyl (p-cyanobenzyl) sulfonium cyclohexyltriphenyl borate, diphenylphenacyl-sulfonium butyltriphenyl borate, diphenyl (p-chlorophenacyl)sulfonium butyltriphenyl borate, diphenyl(p-bromophenacyl)sulfonium butyltriphenyl borate, diphenyl (p-methoxyphenacyl)sulfonium butyltriphenyl borate, diphenyl (p-cyanophenacyl)sulfonium cyclohexyltris(p-methoxyphenyl) borate, bis(p-tertbutylphenyl)phenacylsulfonium sec-butyl(p-fluorophenyl) borate, bis(p-methoxyphenyl) (p-chlorophenacyl)sulfonium dibutyldiphenyl borate, bis(p-chlorophenyl) (p-bromophenacyl)sulfonium benzyltriphenyl borate, bis(p-methylphenyl) (p-methoxyphenacyl) sulfonium tertbutyltriphenyl borate, bis(p-tert-butylphenyl) (p-cyanophenacyl)sulfonium benzyltributyl borate, diphenylallylsulfonium butyltriphenyl borate, diphenyl (2-methyl-3,3-dicyano-2-propenyl)sulfonium-2-phenylethenyltriphenyl borate, diphenyl (2-phenyl-3,3-dicyano-2-propenyl)sulfonium butyltriphenyl borate, diphenyl [2-phenyl-3,3-bis(methoxycarbonyl)-2-propenyl] sulfonium sec-butyltriphenyl borate, bis(p-chlorophenyl) allylsulfonium phenyltriethyl borate, bis(p-tert-butylphenyl) (2-methyl-3,3-dicyano-2-propenyl)sulfonium di(sec-butyl) diphenyl borate, bis(p-methylphenyl) (2-phenyl -3,3-dicyano-2-propenyl)sulfonium butyltriphenyl borate, dimethylacetonylsulfonium butyltriphenyl borate, diphenylcyanomethylsulfonium butyltriphenyl borate, diphenylmethoxycarbonylmethylsulfonium butyltriphenyl borate, diphenylsulfomethylsulfonium methyl tris(p-fluorophenyl) borate, diphenyl-p-toluenesulfonylmethylsulfonium dicyclohexyldiphenyl borate, diphenyl(trimethylammoniumylmethyl)sulfonium bis(butyltriphenyl borate), diphenyl (triphenylphenacylphosphoniumylmethyl)sulfonium bis(butyltriphenyl borate), diphenyl (phenyliodiniumylmethyl) sulfonium bis(butyltriphenyl borate), diphenylbenzyloxosulfonium butyltriphenyl borate, diphenyl(p-cyanobenzyl)oxosulfonium butyltriphenyl borate, diphenyl(p-cyanobenzyl)oxosulfonium sec-butyltriphenyl borate, diphenyl(p-cyanobenzyl) oxosulfonium cyclohexyltris(p-fluorophenyl) borate, diphenylphenacyloxosulfonium butyltriphenyl borate, diphenyl (p-chlorophenacyl)oxosulfonium sec-butyltris(p-fluorophenyl) borate, bis(p-tert-butylphenyl) phenacyloxosulfonium octyltris(p-fluorophenyl) borate, diphenylallyloxosulfonium butyl triphenyl borate, diphenyl (2-phenyl-3,3-dicyano-2-propenyl)oxosulfonium tertbutyltriphenyl borate, diphenylmethoxycarbonylmethyloxosulfonium butyltriphenyl borate, diphenyl (trimethylammoniumylmethyl)oxosulfonium bis(butyltriphenyl borate), and diphenyl (trisphenylphenacyloxosulfoniumylmethyl)oxosulfonium bis(butyltriphenyl borate). Typical compounds (a) to (l) of the sulfonium organoboron complex or oxosulfonium organoboron complex are as follows.

compound (a)

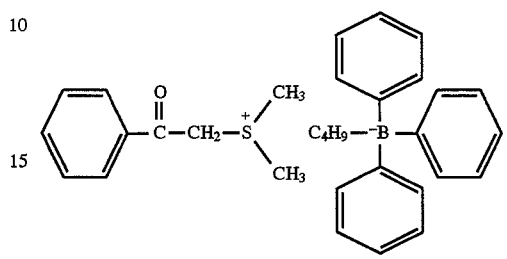

compound (b)

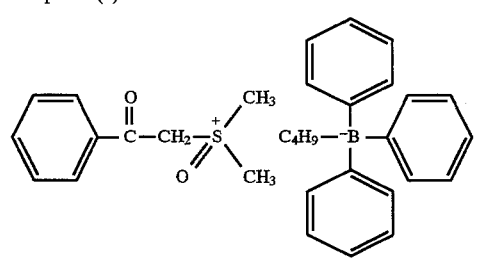

compound (c)

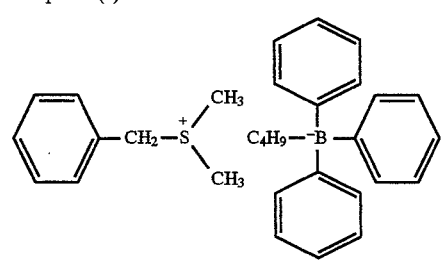

compound (d)

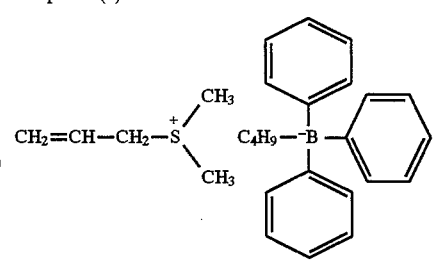

compound (e)

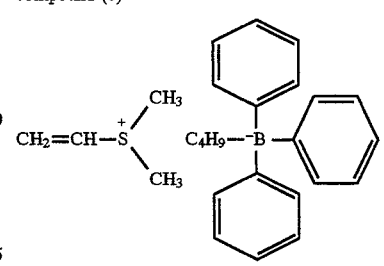

compound (f)
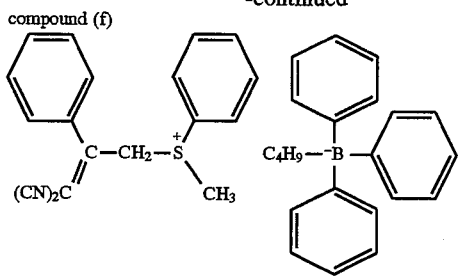

compound (g)
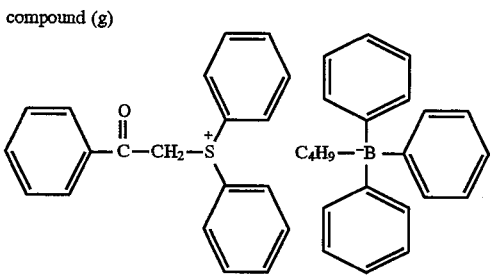

compound (h)
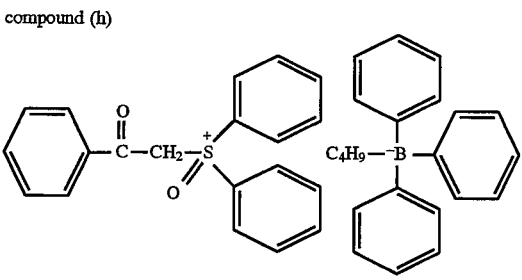

compound (i)
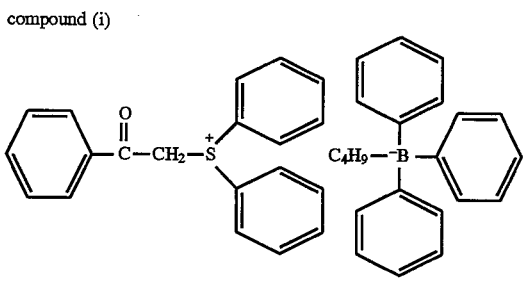

compound (j)
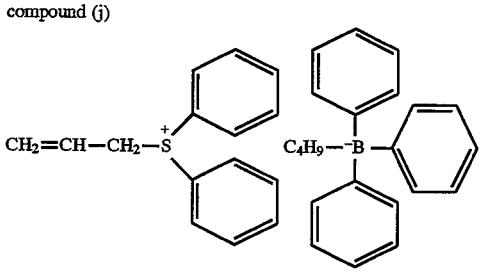

compound (k)
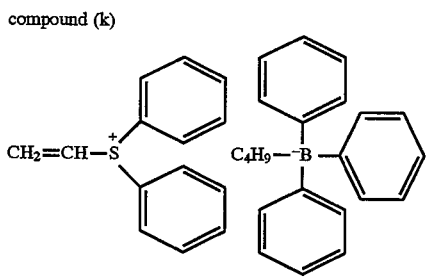

compound (l)
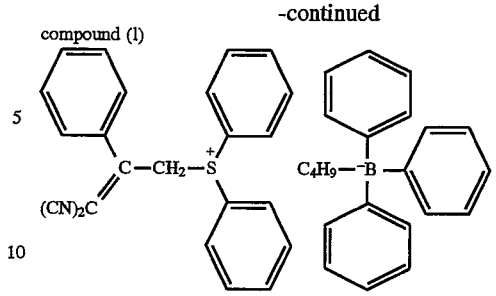

The sensitizer (B) having both the electron donating capability and the electron acceptability in an excited state, used in the present invention, will be explained below.

Although not specially limited, the sensitizer (B) is selected from benzophenone derivatives, thioxanthone derivatives and triazine compounds having a trihalogenomethyl group.

Examples of the benzophenone derivatives include benzophenone, dibenzosuberone, benzoylbenzoate, methyl benzoylbenzoate, 4-phenylbenzophenone, hydroxybenzophenone, acrylated benzophenone, 4-benzoyl-4'-methyldiphenylsulfide, 3,3'-dimethyl-4-methoxybenzophenone, 2,4-dichlorobenzophenone, 2,4'-dichlorobenzophenone, 4,4'-dichlorobenzophenone, 4,4'-morpholinobenzophenone, 4,4'-dimethylaminobenzophenone, 4,4'-diethylaminobenzophenone (EAB), bis]9,9-(2,3,6,7-tetrahydro-1H,5H-benzo[i,j]quinolidinyl]methane, bis(N-ethyl-1,2,3,4-tetrahydro-6-quinolyl)ketone, 3,3,4,4'-tetra(tertbutylperoxycarbonyl)benzophenone, and 4',4"-diethylisophthalone.

Examples of the thioxanthone derivatives include thiaxanthone, 2-chlorothioxanthone, 2-methylthioxanthone, 2,4-dimethylthioxanthone, isopropylthioxanthone, 2,4-dichlorothioxanthone, 2,4-diethylthioxanthone (DETX), and 2,4-diisopropylthioxonthone.

Examples of the triazine compounds having a trihalogenomethyl group include triazine compounds having a chromophoric group. Specific examples thereof include, first, 2-phenyl-4,6-bis(trichloromethyl)-s-trizaine, 2-(p-methoxyphenyl)-4,6-bis(trichloromethyl)-s-triazine, 2-(p-tolyl)- 4,6-bis(trichloromethyl)-s-triazine, 2-(p-chlorophenyl)-4,6-bis(trichloromethyl)-s-triazine, 2-piperonyl-4,6-bis(trichloromethyl)-s-triazine, and compounds which are the same as these except that trichloromethyl is replaced with tribromomethyl. Further, preferred in the present invention are triazine compounds which are improved in the light absorption properties in a region ranging from ultraviolet light to visible light by extending the conjugated system of the chromophoric group. The above triazine compounds are, for example, s-triazine compounds having at least one trihalomethyl group and a conjugation system formed of an ethylenically unsaturated group and a triazine ring and having the following formula (2), and these are described, for example, in JP-A-48-36281 (JP-B-59-1281).

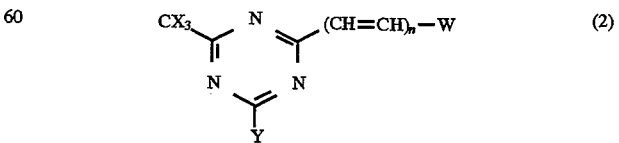 (2)

wherein X is bromine or chlorine, Y is $CX_3$, $-NH_2$, $-NHR$, $-NR_2$ or $-OR$ in which R is phenyl or a lower alkyl having 1 to 6 carbon atoms, n is an integer of 1 to 3, and W is a substituted or unsubstituted aromatic ring or heterocyclic ring. Examples of the above s-triazine compounds include vinyl-halomethyl-s-triazines and methyl-halomethyl-s-triazines such as 2,4-bis(trichloromethyl)-6-styryl-s-triazine, 2,4-bis(trichloromethyl)-6-p-methoxystyryl-s-triazine, 2,4-bis(trichloromethyl)-5-(1-p-dimethylaminophenyl-1,3-butadienyl)-s-triazine, 2,4-bis(trichloromethyl)-6-(N-ethyl-2(3H)-benzoxazolylidine)-ethylidene-s-triazine, 2-trichloromethyl-4-amino-6-p-methoxystyryl-s-triazine, 2,4-bis(tribromomethyl)-6-styryl-s-triazine, 2,4-bis(tribromomethyl)-6-p-methoxystyryl-s-triazine, 2,4-bis(tribromomethyl)-6-1-p-dimethylaminophenyl-1,3,-butadienyl)-s-triazine, 2,4-bis(tribromomethyl)-6-(N-ethyl-2(3H)-benzoxazolylidine)-ethylidene-s-triazine, 2-tribromomethyl-4-amino-6-p-methoxystyryl-s-triazine, and 2,4-bis(trichloromethyl)-6-methyl-s-triazine, 2,4-bis(tribromomethyl)-6-methyl-s-triazine. Typical compounds (1) to (6) of the above s-triazines are as follows.

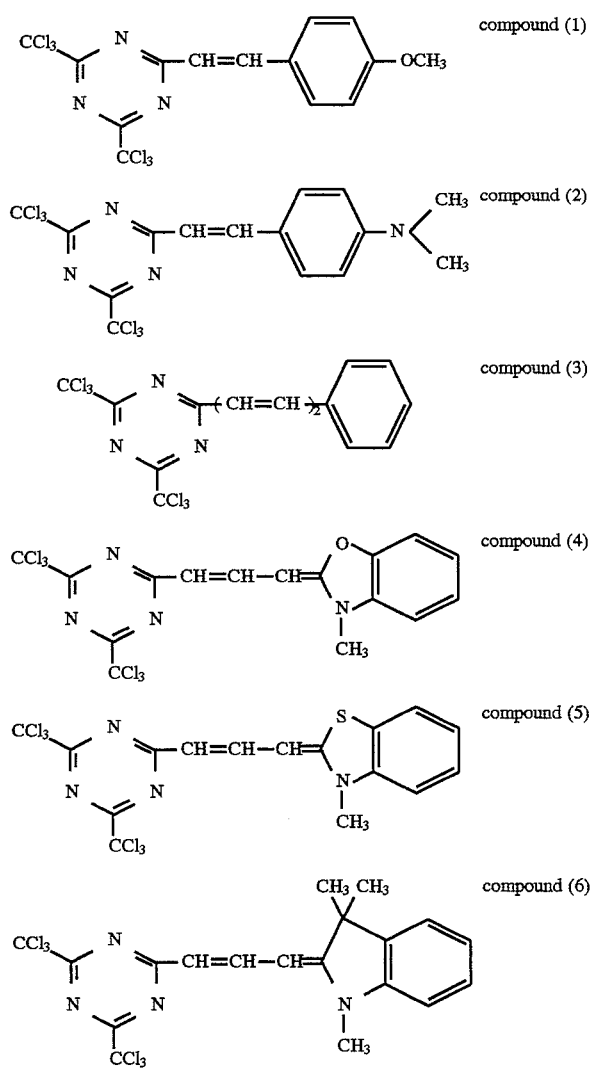

The above triazine compounds are, for example, s-triazine compounds having a group of 2 or 3 substituted or unsubstituted aromatic rings or heterocyclic aromatic rings and 2 halogenomethyl groups and having the following formula (3), and these s-triazine are described, for example, in JP-A-53-133428 (JP-B-62-44258).

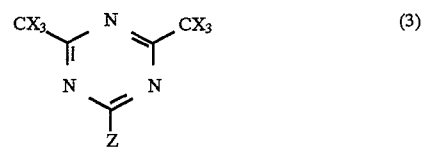

wherein X is bromine or chlorine and Z represents 2 or 3 substituted or unsubstituted aromatic rings or heterocyclic rings.

Examples of these s-triazine compounds include 2-(naphth-1-yl)-4,6-bis(trichloromethyl)-s-triazine, 2-(4-methoxynaphth-1-yl)-4,6-bis(trichloromethyl)-s-triazine, 2-(4-ethoxynaphth-1-yl)-4,6-bis(trichloromethyl)-s-triazine, 2-(4-buthoxynaphth-1-yl)-4,6-bis(trichloromethyl)-s-triazine, 2-[4-(2-methoxyethyl)naphth-1-yl]-4,6-bis(trichloromethyl)-s-triazine, 2-[4-(2-ethoxyethyl)naphth-1-yl]-4,6-bis(trichloromethyl)-s-triazine, 2-[4-(2-butoxyethyl)-naphth-1-yl]-4,6-bis(trichloromethyl)-s-triazine, 2-(2-methoxynaphth-1-yl)-4,6-bis(trichloromethyl)-s-triazine, 2-(6-methoxy-5-methylnaphth-2-yl)-4,6-bis(trichloromethyl)-s-triazine, 2-(6-methoxynaphth-2-yl)-4,6-bis(trichloromethyl)-s-triazine, 2-(5-methoxynaphth-1-yl)-4,6-bis(trichloromethyl)-s-triazine, 2-(4,7-dimethoxynaphth-1-yl)-4,6-bis(trichloromethyl)-s-triazine, 2-(6-methoxynaphth-2-yl)-4,6-bis(trichloromethyl)-s-triazine, 2-(4,5-dimethoxynaphth-1-yl)-4,6-bis(trichloromethyl)-s-triazine, 2-(acenaphth-5-yl)-4,6-bis(trichloromethyl)-s-triazine, 2-(naphth-2-yl)-4,6-bis(trichloromethyl)-s-triazine, 2-(phenathryl-9-yl)-4,6-bis(trichloromethyl)-s-triazine, 2-(dibenzothien-2-yl)-4,6-bis(trichloromethyl)-s-triazine, 2-(benzopyran-3-yl)-4,6-bis(trichloromethyl)-s-triazine, 2(4-methoxyanthracen-1-yl)-4,6-bis(trichloromethyl)-s-triazine, and compounds which are the same as these except that the trichloromethyl is replaced with tribromomethyl. Typical compounds (7) to (10) of the above s-triazine compounds are as follows.

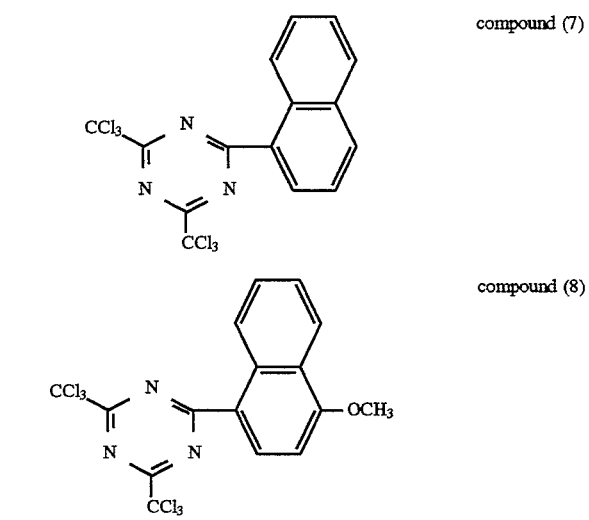

compound (9)

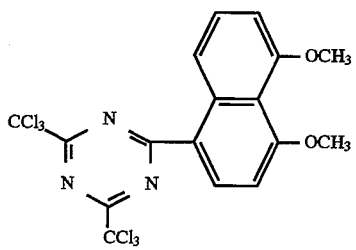

compound (10)

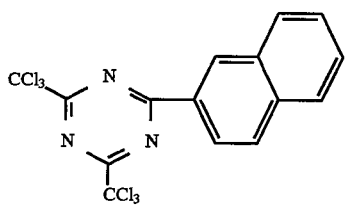

The above triazine compounds are, for example, arylvinylphenyl-bis-trihalogenomethyl s-triazine compounds having the following formula (4), and these s-triazine are described, for example, in JP-A-60-105667 (JP-B-62-44258).

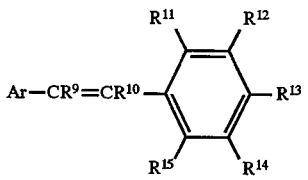

(4)

wherein Ar is a group of 1 to 3 substituted or unsubstituted aromatic rings, each of $R^9$ and $R^{10}$ is independently a hydrogen atom or an alkyl group, each of $R^{11}$ and $R^{13}$ differs from other and is a hydrogen atom or 4,6-bistrihalogenomethyl-s-triazin-2-yl, and each of $R^{12}$ $R^{14}$ and $R^{15}$ is independently a hydrogen atom, a halogen atom, substituted or unsubstituted alkyl, substituted or unsubstituted alkenyl or substituted or unsubstituted alkoxy. Specific compounds (11) to (13) of these s-triazine compounds are as follows.

compound (11)

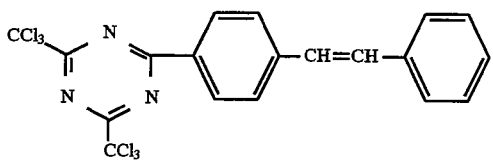

compound (12)

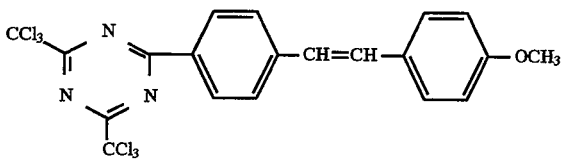

compound (13)

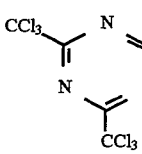

Further, the sensitizer compounds having a trihalogenomethyl group, preferred in the present invention, are carbonylmethylene heterocyclic compounds described in JP-A-60-89473. Specific examples thereof include 2-(p-trichloromethylbenzoylmethylerie)-3-ethylbenzothiazole, 2-(p-trichloromethylbenzoylmethylerie-3-ethyl-5-methylthiazoline, 2-(p-trichloromethylbenzoylmethylene)-3-benzylbenzothiazoline, 2-(p-triehloromethylbenzoylmethylene)-3-methylbenzothiazoline, 2-(trichloroacetylmethylene)-3-methylbenzothiazoline, 2-(p-trichloromethylbenzoylmethylene)-3-(2-methoxyethyl) benzothiazoline, 2-(p-triehloromethylbenzoylmethylene)-3-n-hexylbenzothiazoline, 2-(p-triehloromethylbenzoylmethylene)-3-methylnaphth-[1,2-d] thiazoline, 2-[3,5-bis(trichloromethyl)benzoylmethylene]-3-methylnaphth[1,2-d]thiazoline, 2-trichlroacetylmethylene-3-methyl-naphth[1,2-d]thiazoline, 2-(p-trichloromethylbenzoylmethylene)-3-ethyl-5-methylbenzoselenazoline, 2-(p-triehloromethylbenzoylmethylene)-3-ethyl-5-methoxybenzoselenazoline, 2-trichloroaeetylmethylene-3-ethylbenzoselenazoline, 2-(p-triehloromethylbenzoyl-methylene)-1,3,3-triethyl-5-chloroindoline, 2-(m-triehloromethylbenzoylmethylene)-1,3,3-trimethylindoline, 2-triehloroaeetylmethylene-1,3,3-trimethylindoline, 2-trichlroaeetylmethylene-1,3,3-trimethyl-5-chloroindoline, 2-[3.5-bis(trichloromethyl) benzoylmethylene]-1,3,3-trimethylindoline, 2-[bis(p-trichloromethylbenzoyl)methylene]-3-ethylbenzathiazolone, 2-trichloroacetylmethylene-3-ethylbenzothiazoline, 2 -trichloroacetylmethylene-3-ethyl-5-methylbenzothiazoline, 2-trichloroacetylmethylene-3-benzylbenzothiazoline, 2-(p-trichloromethylbenzoylmethylene)-3-ethyl-4-methyl-5-ethoxycarbonylthiazoline, 2-trichloroacetylmethylene-3-ethyl-4-methyl-5-ethoxycarbonylthiazoline, 2-(p-trichloromethylbenzoylmethylene)-3-ethyl-4,5-diphenylthiazoline, 2-trichloroacetylmethylene-3-ethyl-4,5-diphenylthiazoline, 2-trichloroacetylmethylene-1-methyl-1,2-dihydroquinoline, and 2-bis(triehloroacetylmethylene)-1-methyl-1,2-dihydroquinoline. Further, the triazine compound having a trihalogenomethyl group, used in the present invention, can be selected from triazine compounds disclosed in JP-A-2-3686, JP-A-2-4782, JP-A-2-4787 and JP-A-2-292278, while the triazine compound shall not be limited to these.

The photopolymerization initiator composition of the present invention may be used in combination with other initiator and other sensitizer for further improving the sensitivity or adjusting the spectral properties. The "other" initiator and the "other" sensitizer which can be used as a mixture with the photopolymerization initiator composition of the present invention can be selected from initiators described in "Ultraviolet Light Curing System" (KATO Kiyomi, page 102, 1988, Sogo Gojutsu Center). Specific examples thereof include acetophenone-containing initiators such as 4-phenoxydichloroacetophenone (Sandoz, Sandoray 1000), 4-tert-butyldichloroacetophenone (AKZO, Trigonal-P2), 4-tert-butyltrichloroacetophenone (AKZO, Trigonal-P1), diethoxyacetophenone (Upjohn, DEAP), 2-hydroxy-2-methyl-1-phenylpropan-1-one (Merck, Darocure 1173), 1-(4-isopropylphenyl)-2-hydroxy-2-methylpropan-1-one (Merck, Darocure 1116), 1-(4-dodecylphenyl)-2-hydroxy-2-methylpropan-1-one (Merck, Darocure 953), 4-(2-hydroxyethoxy)-phenyl-(2-hydroxy-2-propyl)ketone (Merck, Darocure 2959), 1-hydroxycyclohexyl phenyl ketone (Ciba Geigy, Irgacure 184) and 2-methyl-1-[4-(methylthio)-phenyl]-2-morpholinopropane-1 (Ciba Geigy, Irgacure 907), benzoin-containing initiators such as benzoin, benzoin methyl ether, benzoin ethyl ether, benzoin isopropyl ether, benzoin isobutyl ether and benzyl dimethyl ketal (Ciba Geigy, Irgacure 651), and ketone-containing initiators such as α-acyloxime ester, methylpbenylglyoxylate, benzil, 9,10-phenanthrenequinone, camphorquinone, dibenzosuberone, 2-ethylanthraquinone and 4',4"-diethylisophthalophenone. Further, the "other" initiator includes imidazole-containing initiators such as 2,2'-bis(2-chloropbenyl)-4,4',5,5'-tetraphenyl-1,2'-imidazole (Esprit, BCIM), carbazole-containing initiators such as A-Cure (Asahi Denka Kogyo K. K.), and acylphosphine oxide-containing initiators such as; 2,4,6-trimethylbenozyldiphenylphosphine oxide.

The photopolymerizable composition of the present invention contains the above photopolymerization initiator composition and a free radical-polymerizable compound (C) having an ethylenically unsaturated bond. The free radical-polymerizable compound (C) having an ethylenically unsaturated bond includes unsaturated acid compounds such as (meth)acrylic acid, iraconic acid and maleic acid, (meth) acrylic acid alkyl esters such as methyl (meth)acrylate, ethyl (meth)acrylate, cyclohcxyl (meth)acrylate and isobornyl (meth)acrylate, vinyl monomers such as tetrahydrofuryl (meth)acrylate, glycidyl (meth)acrylatc, allyl (meth) acrylate, dimethylaminocthyl (meth)acrylate, morphol ino-ethyl (meth)acrylate, (meth)acrylamide, diacetone (meth) acrylamide, 2-hydroxyethyl (meth)acrylate and N-vinylcarbazole, di- or poly(meth)acrylate esters of aliphatic polyhydroxy compounds such as ethylene glycol, dicthylene glycol, triethylene glycol, tetraethylene glycol, propylene glycol, dipropylene glycol, tripropylene glycol, tetrapropylene glycol, neopentyl glycol, 1,3-propanediol, 1,4-butanediol, 1,5-pentanediol, 1,6-hexanediol, 1,10-decanediol, trimethylolpropane, pentaerythritol, dipentaerythritol, neopentyl glycol, sorbitol and mannitol, fluorine atom-containing (meth)acrylate compounds such as trifluoroethyl (meth)acrylate, tetrafluoropropyl (meth) acrylate, hexafluoropropyl (meth)acrylate, octafluoropentyl (meth)acrylate and heptadecafluorodecyl (meth)acrylate, bromine atom-containing (meth)acrylate compounds such as 2,3-dibromopropyl (meth)acrylate, tribromophenoltriethyl-ene oxide (meth)acrylate, p-bromophenoxyethyl (meth) acrylate and tetrabromobisphenol A ethylene (propylene) oxide-modified di(meth)acrylate, aromatic ring-containing (meth)acrylate compounds such as phenyl (meth)acrylate, 4-methoxycarbonylphenyl (meth)acrylate, 4-ethoxycarbonylphenyl (meth)acrylate, 4-butoxycarbonylphenyl (meth)acrylate, 4-tert-butylphenyl (meth)acrylate, benzyl (meth)acrylate, 4-phenoxyethyl (meth)acrylate, 4-phenylethyl (meth)acrylate, 4-phenoxydiethylene glycol (meth)acrylate, 4-phenoxytetraethylene glycol (meth)acrylate, 4-phenoxyhexaethylene glycol (meth)acrylate, 4-biphenylyl (meth)acrylate and epichlorohydrin phthalate-modified (meth)acrylate, aromatic polyhydroxy compounds such as poly (meth)acrylate compounds of hydroquinone, resorcin, catechol and pyrogallol, ethylene (propylene) oxide-modified (meth)acrylate of isocyanuric acid, bisphenol A ethylene (propylene) oxide-modified di(meth)acrylate, a (meth)acrylated epoxy resin, and heavy metal atom-containing (meth)acrylate compounds such as zinc di(meth) acrylate.

When the above triazine compound having a trihalo-genomethyl group is used as a sensitizer in the present invention, an acid can be generated by the irradiation with light, so that a compound having a cation-photopolymerizable functional group can be used as a polymerizable compound for constituting the photopolymerizable composition of the present invention. The above compound having a cation-photopolymerizable functional group includes styrenes, epoxy compounds, vinyl ether compounds, spiroorthoesters and spiroorthoearbonates. In particular, epoxy compounds and vinyl ether compounds are preferred in the present invention.

Specific examples of the epoxy compounds include aromatic epoxy monomers such as phenyl glycidyl ether, o-cresyl glycidyl ether, tert-butylphenyl glycidyl ether, bisphenol A diglycidyl ether, tetrabromobisphenol A diglycidyl ether, bisphenol F diglycidyl ether, tetrabromobisphenol F diglycidyl ether, diglycidyl resorcinol ether, 2-phenylethylene oxide, diglycidyl isophthalate and an ESP-300 (supplied by Shin-Nittetsu Chemical), aromatic epoxy resins such as a (brominated) bisphenol A type epoxy resin, a (brominated) bisphenol F type resin, a (brominated) phenol novolak type epoxy resin and a (brominated) cresol novolak type resin, and a glycidyl ether obtained by a reaction between an adduct of a bisphenol compound with alkylene oxide (e.g., ethylene oxide or propylene oxide) and epichlorohydrin.

Further, aliphatic epoxy compounds can be used, and examples thereof include alicyclic epoxy compounds such as 3,4-epoxycyclohexylmethyl-3,4-epoxycyclohexane carboxylate, bis(3,4-epoxycyclohexylmethyl)adipate, 2-(3, 4-epoxycyclohexyl-5,5-spiro-3,4-epoxy)cyclohexanone-m-dioxane, bis(2,3-epoxycyclopentyl) ether and EHPE-3150 (alicyclic epoxy resin supplied by Daicel Chemical) and polyglycidyl ether monomers of aliphatic polyhydric alcohols or addnets thereof with alkylene oxides such as diglycidyl ether of 1,4-butanediol, diglycidyl ether of 1,6-hexanediol, triglycidyl ether of glycerin, triglycidyl ether of trimethylolpropane, diglycidyl ether of polyethylene glycol, diglycidyl ether of propylene glycol, and polyglycidyl ether of polyether polyol obtained by adding at least one alkylene oxide (ethylene oxide, propylene oxide) to an aliphatic polyhydric alcohol such as ethylene glycol, propylene glycol or glycerin.

Examples of the vinyl ether compounds include monofunctional vinyl ethers such as hydroxybutyl vinyl ethel (Rapi-Cure HBVE, supplied by GAF) and dodecyl vinyl ether (Rapi-Cure DDVE, supplied by GAF), and polyvinyl ethers of polyhydric alcohols such as 1,4-butanediol vinyl ether, triethylene glycol divinyl ether (Rapi-Cure DVE-3, supplied by GAF), tripropylene glycol divinyl ether, 3-methyl-1,5-pentanediol divinyl ether, 1,4-cyclohexanedimethanol divinyl ether and trimethylolpropane trivinyl ether. A vinyl ether compound of which the molecule has an aromatic ring or a heterocyclic ring can be also used. Examples of the vinyl ether compound include 4-vinyl ether styrene, hydroqninone divinyl ether, phenyl vinyl ether, bisphenol A divinyl ether, tetrabromobisphenol A divinyl ether, bisphenol F divinyl ether, tetrabromobisphenol F divinyl ether, phenoxyethylene vinyl ether, p-bromophenoxyethylene vinyl ether, and 2-carbazoyl vinyl ether. The above compounds having a cation photopolymerizable functional group may be used alone or in combination, and may be used together with the above compound having an ethylenically unsaturated bond.

The photopolymerizable composition of the present invention may contain various additives for overcoming various problems in practical use. For example, for preventing the thermal polymerization during its storage, the photopolymerizable composition may contain any one of thermal polymerization inhibitors such as p-methoxyphenol, hydroquinone, catechol, phenothiazine and cupferron. For promoting the polymerization, it may contain any one of chain transfer agents such as an amine, a thiol and a disulfide, an antifoaming agent, a leveling agent, a plasticizer, an antioxidant, a flame retardant, an antistatic agent and a halation preventer.

When the compound having an ethylenically unsaturated bond is in a liquid state, the photopolymerizable composition of the present invention may be prepared in the form of a solution or dispersion of the photopolymerization initiator composition in the above compound. When the above compound is in a solid state, the photopolymerizable composition may be prepared in the form of a solution or dispersion of the photopolymerizable composition in an aqueous or organic solvent.

The above photopolymerizable composition may be applied to, printed on, or transferred to, a proper substrate, or sealed into a space between proper substrates to form a photosensitive layer. The application is preferably carried out with a spinner or a coater. The printing is preferably carried out by relief printing, lithographic printing, intaglio printing or screen printing. Further, the photopolymerizable composition may be applied to a curved surface by an immersion method, and an electrodeposition method may be also used. Then, the photosensitive layer is exposed to light energy from a light source which generates ultraviolet light, selected from a low-pressure mercury lamp, an intermediate-pressure mercury lamp, a high-pressure mercury lamp, an ultrahigh-pressure mercury lamp, a xenon lamp, a carbon arc lamp, a metal halide lamp, a fluorescent lamp, a white lamp, a tungsten lamp, various laser light sources (gas, diode or solid laser), a CRT light source and a plasma light source, whereby an intended polymer or a cured product can be obtained. It is essential that the light source be one which generates light in the absorption wavelength region of the sensitizer (B) used in the present invention. When exposed to such light, the radical polymerization of the photopolymerizable composition of the present invention is initiated, and a cured product can be obtained.

The irradiation with light may be carried out by any one of a direct irradiation method in which the photosensitive layer is directly exposed to light, a pattern exposure method in which it is exposed light through a mask film, a scanning irradiation method and an interference irradiation method using a laser, as required depending a purpose. Further, the exposed photosensitive layer may be post-baked at a proper temperature for the promotion of the polymerization. The temperature for the post-baking is preferably between 40° and 250° C., more preferably between 80° and 200° C.

The photopolymerization initiator composition and the photopolymerizable composition of the present invention can be suitably adapted for use in the fields of a photo-setting ink, photo-setting paint and coating composition, photo-setting adhesive and sealing agent, photo-setting sealant and composite, a photo-setting ink jet, a photo-setting microcapsule, a photosensitive printing plate, a photoresist ink, a proofing material, an optically molding resin and a hologram material.

In the photopolymerization initiator composition of the present invention, the sulfonium organoboron complex or the oxosulfonium organoboron complex (A) and the sensitizer (B) may be combined in any mixing ratio, while the amount of the sensitizer (B) is preferably such an amount that the absorbance of the composition to the wavelength of the light source does not exceed 2. Further, the amount of the photopolymerization initiator composition in the photopolymerizable composition is preferably 0.1 to 30% by weight.

Further, the photopolymerizable composition of the present invention may contain an oligomer and a polymer having a high molecular weight as required. The oligomer or the polymer having a high molecular weight may be one which is a reactive compound having a radical-polymerizable functional group or may be one which has no such functional group.

The sulfonium organoboron complex or the oxosulfonium organoboron complex (A) used in the present invention generates free radical by the light absorption of the sensitizer (B) having both the electron donating capability and the electron acceptability in an excited state and the subsequent photochemical interaction between these two components. The mechanism of the above free radical generation is not clear, while it is assumed that the sulfonium or oxosulfonium organoboron complex (A) is decomposed as a result of the photochemical interaction, and free radicals are generated from both the sulfonium cation portion and the borate anion portion, which is considered to produce the high sensitivity in the radical polymerization.

The present invention will be explained hereinafter with reference to Examples, in which "part" stands for "part by weight".

EXAMPLE 1

4 Parts of Compound (a) as a sulfonium or oxosulfonium organoboron complex, 2 parts 4,4'-diethylaminobenzophenone (EAB) as a sensitizer, 50 parts of pentaerythritol triacrylate as a free radical-polymerizable compound having an ethylenically unsaturated bond, and 50 parts of polymethyl methacrylate as a polymer binder were dissolved in 900 parts of methyl ethyl ketone, and the resultant solution was applied to a glass plate to form a photosensitive layer having a thickness of 2 μm. The so-prepared photosensitive layers were exposed to 365 nm light (0.5 mW/cm$^2$) from an ultrahigh-pressure mercury lamp at 500 W through a mask film for various periods of time, and then developed with toluene at room temperature for 30 seconds. As a result, remaining cured films insoluble in toluene were obtained when the photosensitive layers were exposed for at least 1 second (0.5 mJ/cm$^2$).

EXAMPLES 2–12

Photosensitive layers were prepared in the same manner as in Example I except that Compound (a) as a sulfonium or oxosulfonium organoboron complex was replaced with Compound (b) to (1) as shown in Table 1. Then, remaining cured film were obtained in the same manner as in Example 1. Table 1 shows the minimum exposure times (second) for which the remaining cured films insoluble in toluene were obtained.

TABLE 1

| Example | Sulfonium organoboron complex | Sensitizer | Minimum exposure time for which remaining cured film is obtained |
|---|---|---|---|
| 1 | Compound (a) | EAB | 1 |
| 2 | Compound (b) | EAB | 0.5 |
| 3 | Compound (c) | EAB | 3 |
| 4 | Compound (d) | EAB | 3 |
| 5 | Compound (e) | EAB | 3 |
| 6 | Compound (f) | EAB | 2 |
| 7 | Compound (g) | EAB | 1 |
| 8 | Compound (h) | EAB | 0.5 |
| 9 | Compound (i) | EAB | 2 |
| 10 | Compound (j) | EAB | 2 |
| 11 | Compound (k) | EAB | 2 |
| 12 | Compound (l) | EAB | 1 |

(EAB)

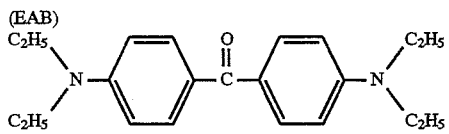

EXAMPLES 13–24

Examples 1 to 12 were repeated except that EAB was replaced with 6 parts of 2,4-diethylthioxanthone (DETXO). Table 2 shows the minimum exposure times (second) for which the remaining cured films insoluble in toluene were obtained.

TABLE 2

| Example | Sulfonium organoboron complex | Sensitizer | Minimum exposure time for which remaining cured film is obtained |
|---|---|---|---|
| 13 | Compound (a) | DETX | 1.5 |
| 14 | Compound (b) | DETX | 1 |
| 15 | Compound (c) | DETX | 4 |
| 16 | Compound (d) | DETX | 4 |
| 17 | Compound (e) | DETX | 4 |
| 18 | Compound (f) | DETX | 3 |
| 19 | Compound (g) | DETX | 2 |
| 20 | Compound (h) | DETX | 1 |
| 21 | Compound (i) | DETX | 3 |
| 22 | Compound (j) | DETX | 3 |
| 23 | Compound (k) | DETX | 3 |
| 24 | Compound (l) | DETX | 2 |

(DETX)

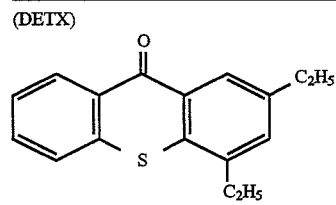

EXAMPLES 25–36

Examples 1 to 12 were repeated except that EAB was replaced with 3 parts of 2,4-trichloromethyl-(4'-methoxyphenyl)-6-triazine (Compound 1). Table 3 shows the minimum exposure times (second) for which the remaining cured films insoluble in toluene were obtained.

TABLE 3

| Example | Sulfonium organoboron complex | Sensitizer | Minimum exposure time for which remaining cured film is obtained |
|---|---|---|---|
| 25 | Compound (a) | Compound (1) | 3 |
| 26 | Compound (b) | Compound (1) | 2 |
| 27 | Compound (c) | Compound (1) | 5 |
| 28 | Compound (d) | Compound (1) | 5 |
| 29 | Compound (e) | Compound (1) | 5 |
| 30 | Compound (f) | Compound (1) | 4 |
| 31 | Compound (g) | Compound (1) | 3 |
| 32 | Compound (h) | Compound (1) | 2 |
| 33 | Compound (i) | Compound (1) | 3 |
| 34 | Compound (j) | Compound (1) | 3 |
| 35 | Compound (k) | Compound (1) | 3 |
| 36 | Compound (l) | Compound (1) | 3 |

EXAMPLES 37–48

Example 25 was repeated except that the 2,4-trichloromethyl-(4'-methoxyphenyl)-6-triazine (Compound 1) was replaced with 3 parts of one of Compounds (2) to (13). Table 4 shows the minimum exposure times (second) for which the remaining cured films insoluble in toluene were obtained.

TABLE 4

| Example | Sulfonium organoboron complex | Sensitizer | Minimum exposure time for which remaining cured film is obtained |
|---|---|---|---|
| 37 | Compound (a) | Compound (2) | 3 |
| 38 | Compound (a) | Compound (3) | 2 |
| 39 | Compound (a) | Compound (4) | 2 |
| 40 | Compound (a) | Compound (5) | 2 |
| 41 | Compound (a) | Compound (6) | 2 |
| 42 | Compound (a) | Compound (7) | 2 |
| 43 | Compound (a) | Compound (8) | 2 |
| 44 | Compound (a) | Compound (9) | 2 |
| 45 | Compound (a) | Compound (10) | 2 |
| 46 | Compound (a) | Compound (11) | 2 |
| 47 | Compound (a) | Compound (12) | 2 |
| 48 | Compound (a) | Compound (13) | 2 |

Comparative Example 1

Example 1 was repeated except that Compound (a) was not used. As a result, no remaining film was obtained even after the exposure was carried out for more than 1,000 seconds.

Comparative Example 2

Example 13 was repeated except that Compound (a) was not used. As a result, a remaining film was obtained when the exposure was carried out for 30 seconds.

Comparative Example 3

Example 25 was repeated except that Compound (a) was not used. As a result, a remaining film was obtained when the exposure was carried out for 7 seconds.

What is claimed is:

1. A photopolymerization initiator composition containing (A) a sulfonium organoboron complex or oxosulfonium organoboron complex of the formula (1),

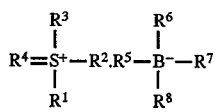

wherein R¹ is benzyl, substituted benzyl, phenacyl, substituted phenacyl, aryloxy, substituted aryloxy, alkenyl or substituted alkenyl, each of R² and R³ is independently benzyl, substituted benzyl, phenacyl, substituted phenacyl, aryloxy, substituted aryloxy, alkenyl, substituted alkenyl, alkyl, substituted alkyl, aryl, substituted aryl, aralkyl, substituted aralkyl, alkynyl, substituted alkynyl, alicyclic, substituted alicyclic, alkoxy, substituted alkoxy, alkylthio, substituted alkylthio, amino, substituted amino, arylthio or substituted arylthio, or R² and R³ bond to each other to form a cyclic structure, R⁴ is oxygen or a lone pair of electrons, and each of R⁵, R⁶, R⁷ and R⁸ is independently alkyl, substituted alkyl, aryl, substituted aryl, aralkyl, substituted aralkyl, alkenyl or substituted alkenyl, provided that not all of R⁵, R⁶, R⁷ and R⁸ are aryl or substituted aryl groups, and (B) a sensitizer selected from the group consisting of a benzophenone derivative, a triazine derivative having a trihalogenomethyl group and 2,4-diethylthioxanthone.

2. A photopolymerization initiator composition according to claim 1, wherein the sensitizer is 4,4'-diethylaminobenzophenone.

3. A photopolymerization initiator composition according to claim 1, wherein the triazine compound is one of s-triazine compounds having at least one trihalomethyl group and a conjugation system formed of an ethylenically unsaturated group and a triazine ring and having the following formula (2),

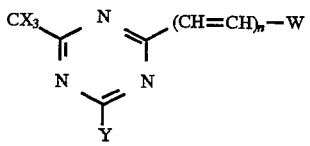

wherein X is bromine or chlorine, Y is CX₃, —NH₂, —NHR, —NR₂ or —OR in which R is phenyl or a lower alkyl having 1 to 6 carbon atoms, n is an integer of 1 to 3, and W is a substituted or unsubstituted aromatic ring or heterocyclic ring.

4. A photopolymerization initiator composition according to claim 1, wherein the triazine compound is one of s-triazine compounds having a group of 2 or 3 substituted or unsubstituted aromatic rings or heterocyclic aromatic rings and 2 halogenomethyl groups and having the following formula (3),

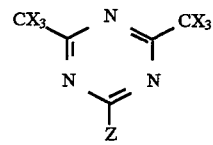

wherein X is bromine or chlorine and Z represents 2 or 3 substituted or unsubstituted aromatic rings or heterocyclic rings.

5. A photopolymerization initiator composition according to claim 1, wherein the triazine compound is one of arylvinylphenyl-bis-trihalogenomethyl s-triazine compounds, having the following formula (4),

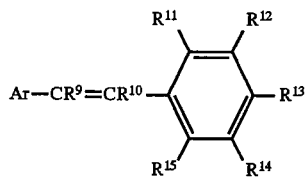

wherein Ar is a group of 1 to 3 substituted or unsubstituted aromatic rings, each of R⁹ and R¹⁰ is independently a hydrogen atom or an alkyl group, each of R¹¹ and R¹³ differs from other and is a hydrogen atom or 4,6-bistrihalogenomethyl-s-triazin-2-yl, and each of R¹², R¹⁴ and R¹⁵ is independently a hydrogen atom, a halogen atom, substituted or unsubstituted alkyl, substituted or unsubstituted alkenyl or substituted or unsubstituted alkoxy.

6. A photopolymerizable composition containing the photopolymerization initiator composition as recited in claim 1 and (C) a compound having an ethylenically unsaturated bond.

7. A photopolymerizable composition according to claim 6, wherein the photopolymerization initiator composition contains, as a sensitizer, a triazine compound having a trihalogenomethyl group and the compound having an ethylenically unsaturated bond bas a cation photopolymerizable functional group.

8. A photopolymerizable composition according to claim 7, wherein the compound having a cation photopolymerizable functional group is at least one compound selected from the group consisting of styrene, an epoxy compound, a vinyl ether compound, spiroorthoester and spiroorthocarbonate.

* * * * *

UNITED STATES PATENT AND TRADEMARK OFFICE
CERTIFICATE OF CORRECTION

PATENT NO. : 5,631,307
DATED : May 20, 1997
INVENTOR(S) : YASUHIRO TANAKA, YASUMASA TOBA, MADOKA YASUIKE, TADASHI TANOUE and KAORU NAKAJIMA

It is certified that error appears in the above-identified patent and that said Letters Patent is hereby corrected as shown below:

```
     Column 20, in claim 7, line 2 from the bottom, "bas"
should be --has--.
```

Signed and Sealed this

Twenty-fourth Day of March, 1998

Attest:

BRUCE LEHMAN

*Attesting Officer*  Commissioner of Patents and Trademarks